(12) United States Patent
Ono et al.

(10) Patent No.: US 11,530,785 B2
(45) Date of Patent: Dec. 20, 2022

(54) METHOD FOR MANUFACTURING LAMINATED SUBSTRATE, LAMINATED SUBSTRATE, AND LIGHT EMITTING ELEMENT SUBSTRATE

(71) Applicant: FUJIFILM Business Innovation Corp., Tokyo (JP)

(72) Inventors: Seiji Ono, Ebina (JP); Yoshinao Kondo, Ebina (JP); Mutsuya Takahashi, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 0 days.

(21) Appl. No.: 17/370,702

(22) Filed: Jul. 8, 2021

(65) Prior Publication Data
US 2022/0268407 A1    Aug. 25, 2022

(30) Foreign Application Priority Data

Feb. 19, 2021    (JP) .............................. JP2021-025527

(51) Int. Cl.
*F21K 9/90*    (2016.01)
*B32B 38/10*    (2006.01)
*F21V 23/00*    (2015.01)

(52) U.S. Cl.
CPC ................ *F21K 9/90* (2013.01); *B32B 38/10* (2013.01); *F21V 23/002* (2013.01); *B32B 2457/00* (2013.01)

(58) Field of Classification Search
CPC .................................................... F21V 23/002
See application file for complete search history.

(56) References Cited

U.S. PATENT DOCUMENTS

2019/0115491 A1    4/2019    Furuta

FOREIGN PATENT DOCUMENTS

| JP | 2011-204771 A | 10/2011 |
| JP | 2019-111664 A | 7/2019 |

OTHER PUBLICATIONS

Search Report dated Feb. 8, 2022 by the European Patent Office in counterpart European Patent Application No. 21191358.7.

*Primary Examiner* — Vip Patel
(74) *Attorney, Agent, or Firm* — Sughrue Mion, PLLC

(57) ABSTRACT

A method for manufacturing a laminated substrate includes removing a portion not covered with a resist layer from a laminated substrate with an etchant to form a wiring, the laminated substrate including: a base layer including a mesa portion having a trapezoidal cross section, the mesa portion having a first inclined surface extending downward and outward from a top surface and a second inclined surface having an eaves-shaped portion protruding outward from the top surface; a wiring layer formed on an upper surface of the base layer; and the resist layer formed on an upper surface of the wiring layer and having a shape corresponding to a shape of the wiring, and the wiring is arranged at a position where the wiring covers a whole of the eaves-shaped portion of the second inclined surface.

6 Claims, 16 Drawing Sheets

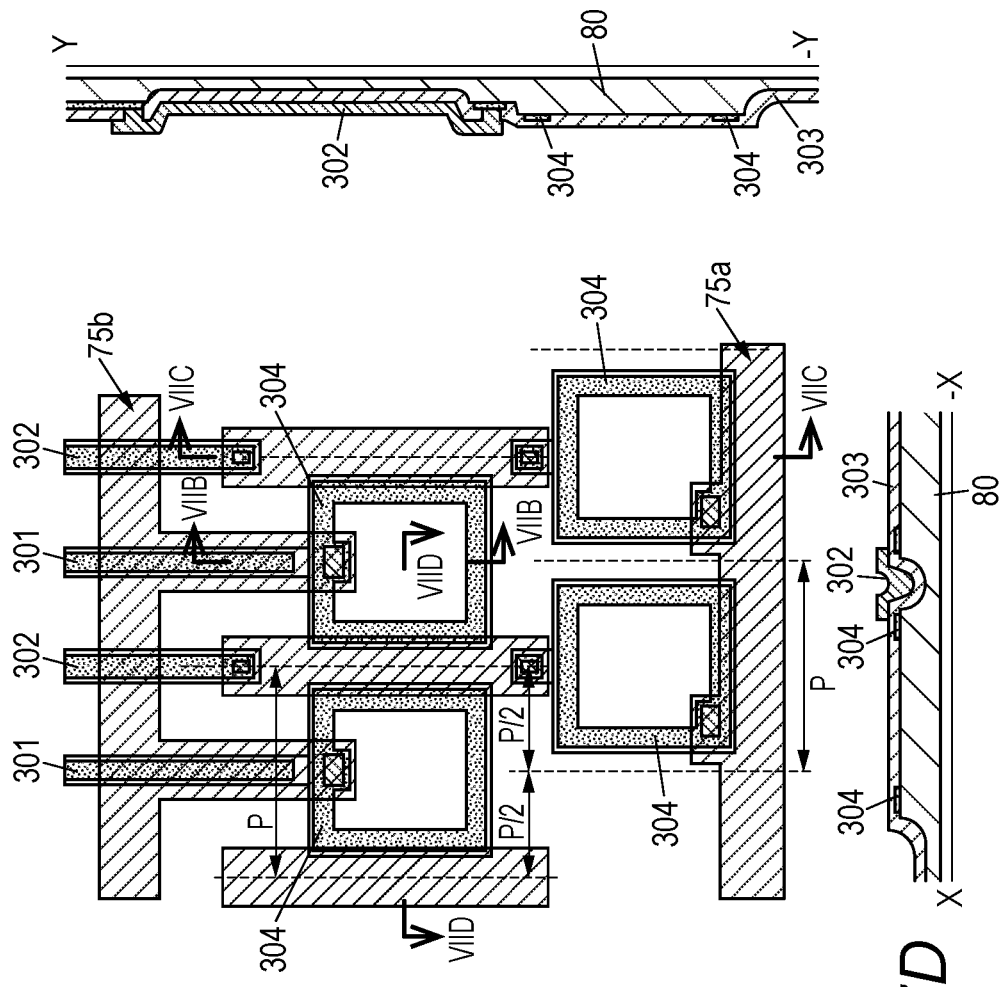

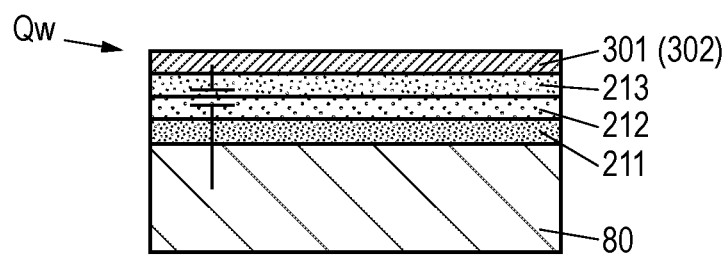
FIG. 8A
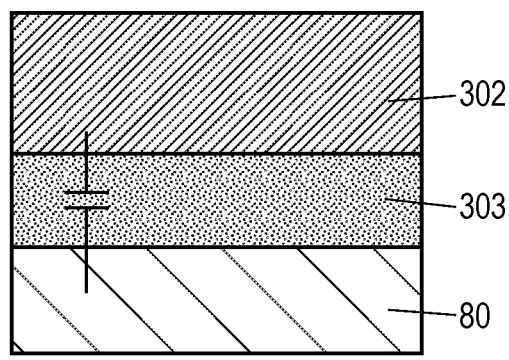
FIG. 8B
FIG. 9A
FIG. 9B
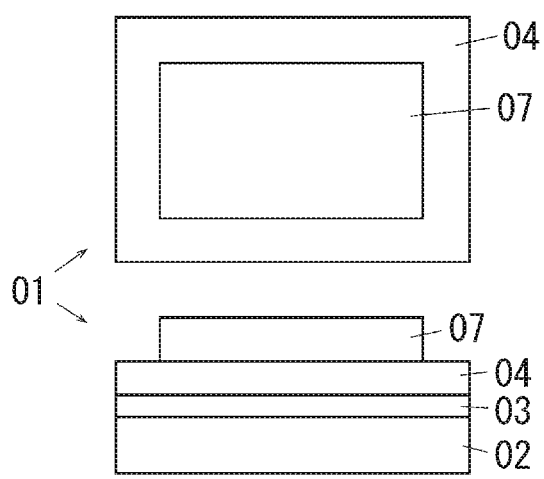
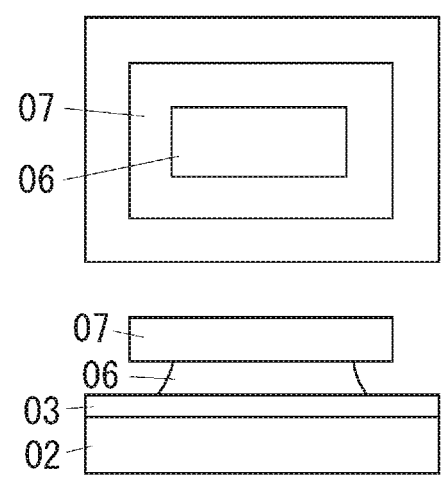

000
METHOD FOR MANUFACTURING LAMINATED SUBSTRATE, LAMINATED SUBSTRATE, AND LIGHT EMITTING ELEMENT SUBSTRATE

CROSS-REFERENCE TO RELATED APPLICATIONS

This application is based on and claims priority under 35 USC 119 from Japanese Patent Application No. 2021-025527 filed on Feb. 19, 2021.

BACKGROUND

Technical Field

The present invention relates to a method for manufacturing a laminated substrate, a laminated substrate, and a light emitting element substrate.

Related Art

Regarding a structure of a light emitting device such as a latent image forming device that forms a latent image or a static elimination device in an image forming device, a technique described in JP-A-2019-111664 is common in the related art.

JP-A-2019-111664 discloses, in paragraphs [0155] to [0174] and FIGS. 12 to 15, a manufacturing method in which a p-type semiconductor or an n-type semiconductor is sequentially laminated and then a portion other than a portion having a target shape is etched (mesa-etched) to obtain a target circuit in the technique for manufacturing a thyristor, a transistor or the like for a light emitting element head.

SUMMARY

Aspects of non-limiting embodiments of the present disclosure relate to preventing disconnection of a metal wiring in a case where there is an eaves-shaped portion protruding outward from a top surface of a trapezoid when a laminated substrate including a mesa portion having a trapezoidal cross section is manufactured, as compared with a case where the wiring is formed in a part of the eaves-shaped portion.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a method for manufacturing a laminated substrate, including: removing a portion of a wiring layer not covered with a resist layer from a laminated substrate with an etchant to form a wiring, the laminated substrate including: a base layer including a mesa portion having a trapezoidal cross section, the mesa portion having a first inclined surface extending downward and outward from a top surface and a second inclined surface having an eaves-shaped portion protruding outward from the top surface; the wiring layer formed on an upper surface of the base layer; and the resist layer formed on an upper surface of the wiring layer and having a shape corresponding to a shape of the wiring, in which the wiring is arranged at a position where the wiring covers a whole of the eaves-shaped portion of the second inclined surface.

BRIEF DESCRIPTION OF THE DRAWINGS

Exemplary embodiment(s) of the present invention will be described in detail based on the following figures, wherein:

FIGS. 7A to 7D are explanatory views of the light emitting chip according to the exemplary embodiment, and FIG. 7A is a plan view thereof, FIG. 7B is a cross-sectional view taken along a line VIIB-VIIB in FIG. 7A, FIG. 7C is a cross-sectional view taken along a line VIIC-VIIC in FIG. 7A, and FIG. 7D is a cross-sectional view taken along a line VIID-VIID in FIG. 7A;

FIGS. 8A and 8B are explanatory views of a circuit according to the exemplary embodiment, and FIG. 8A is an explanatory view of a laminated structure of a first wiring portion, and FIG. 8B is an explanatory view of a laminated structure of a second wiring portion;

FIGS. 9A and 9B are explanatory views of a method for manufacturing a laminated substrate, and FIG. 9A is an explanatory view of a substrate including no mesa portion before etching, and FIG. 9B is an explanatory view of the substrate in FIG. 9A after etching;

FIG. 10A is a plan view thereof, FIG. 10B is a view seen from a direction of the arrow XB in FIG. 10A, and FIG. 10C is a view seen from a direction of the arrow XC in FIG. 10A;

FIG. 11A is an explanatory view of a state where a film is formed on the inverted mesa portion, and FIG. 11B is an explanatory view of a state after etching from the state in FIG. 11A;

FIG. 12A is an explanatory view of a state before etching, FIG. 12B is an explanatory view of a state after a wiring layer is formed, and FIG. 12C is an explanatory view of a state after etching;

FIG. 14A is an explanatory view of a state where a wiring layer is formed, FIG. 14B is an explanatory view of a state where etching is progressed by a thickness of the wiring layer, and FIG. 14C is an explanatory view of a state where etching is completed;

FIG. 15A is an explanatory view of a state before etching in a case where the inverted mesa portion is present on one side of the wiring, and FIG. 15B is an explanatory view of a state after etching in the case where the inverted mesa portion is present on one side of the wiring;

FIG. 16A is an explanatory view of a state before etching in a case where the inverted mesa portions are present on both sides of the wiring, and FIG. 16B is an explanatory view of a state after etching in the case where the inverted mesa portions are present on both sides of the wiring;

FIG. 18A is an explanatory view of a state where the oblique end edge is not formed, and FIG. 18B is an explanatory view of a state where the oblique end edge is formed.

DETAILED DESCRIPTION

Figure 1:
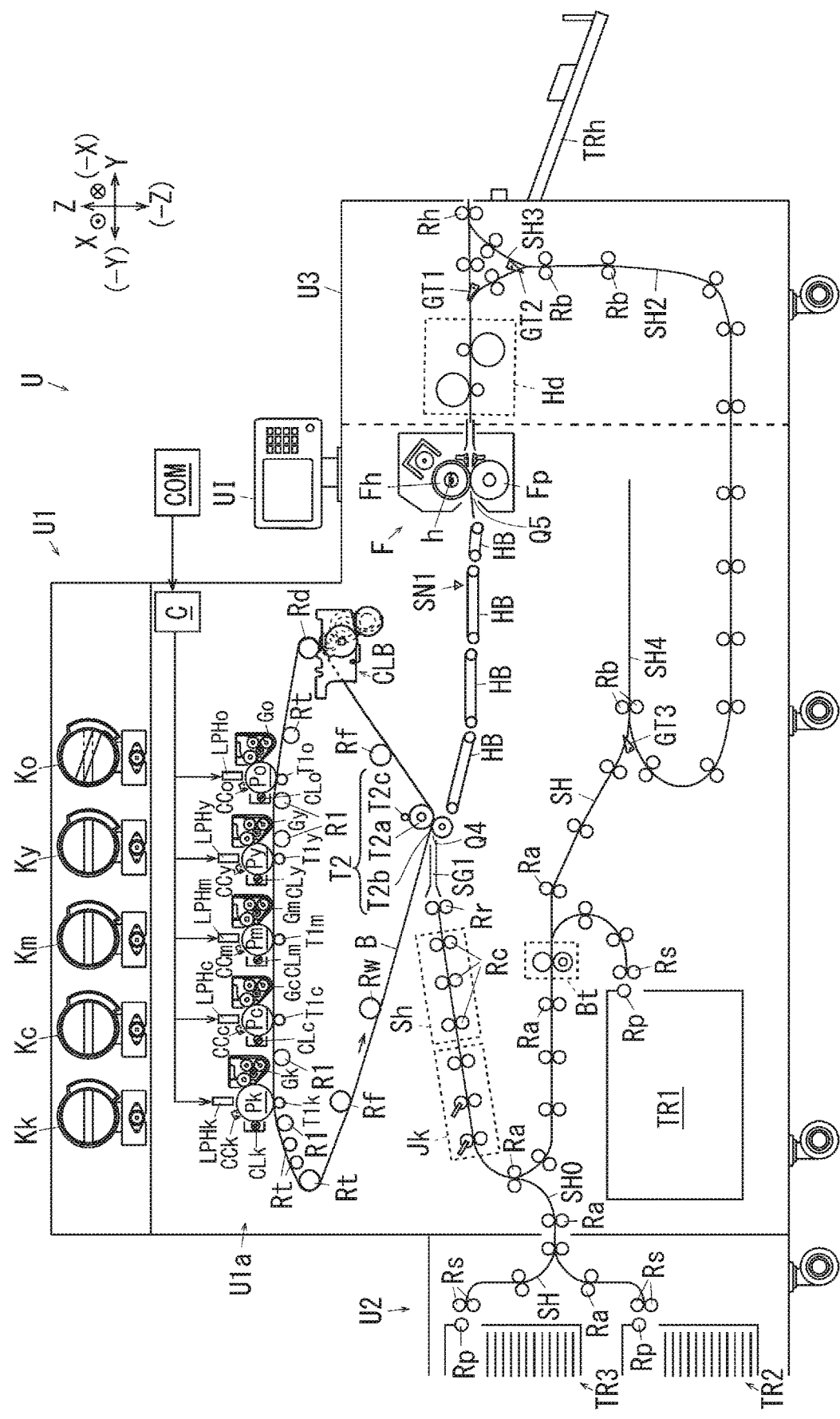
FIG. 1 is an overall explanatory view of an image forming device according to an exemplary embodiment.

Next, exemplary embodiments of the present invention will be described with reference to the drawings, but the present invention is not limited to the following exemplary embodiments.

In order to facilitate understanding of the following description, in the drawings, a front-rear direction (a width direction of a medium) is defined as an X-axis direction, a left-right direction (a transport direction of the medium) is defined as a Y-axis direction, an upper-lower direction is defined as a Z-axis direction, and directions or sides indicated by arrows X, −X, Y, −Y, Z, −Z are defined as a front direction, a rear direction, a right direction, a left direction, an upper direction, a lower direction, respectively, or a front side, a rear side, a right side, a left side, an upper side and a lower side, respectively.

In the drawings, the one with "•" in "○" means an arrow directed from a rear side to a front side of a paper surface, and the one with "x" in "○" means an arrow directed from the front side to the rear side of the paper surface.

In the following description with reference to the drawings, members other than those necessary for the description are omitted as appropriate for ease of understanding.

(Description of Overall Configuration of Printer U)

FIG. 1 is an overall explanatory view of an image forming device according to an exemplary embodiment.

In FIG. 1, a printer U as an example of the image forming device according to the exemplary embodiment of the present invention includes a printer body U1, a feeder unit U2 as an example of a supply device that supplies a medium to the printer body U1, an operation unit U1 through which a user performs an operation, and a finisher U3 as an example of a post-processing device that performs post-processing on the medium discharged from the printer body U1.

(Description of Marking Configuration)

In FIG. 1, the printer body U1 includes a controller (an example of a control unit) C that controls the printer U, a communication unit (not shown) that receives image information transmitted from a print image server COM as an example of an information transmission device connected to outside of the printer U via a dedicated cable (not shown), a marking unit U1a as an example of a recording unit that records an image on the medium, and the like. The print image server COM is connected to a personal computer PC as an example of an image transmission device that is connected via a line such as a cable or a local area network (LAN) and to which information of the image to be printed by the printer U is transmitted.

The marking unit U1a includes, as an example of an image carrying unit, photoconductors Py, Pm, Pc and Pk for colors of yellow (Y), magenta (M), cyan (C) and black (K), respectively, and a photoconductor Po that gives gloss to an image when a photographic image or the like is printed. Surfaces of the photoconductors Py to Po are made of a photosensitive dielectric.

In FIG. 1, a charger CCk as an example of a charging unit, an exposure device LPHk as an example of a latent image forming unit, a developing device Gk as an example of a developing unit, a primary transfer roll T1k as an example of a primary transfer unit, and a photoconductor cleaner CLk as an example of a cleaning unit for an image carrying unit are arranged around a black photoconductor Pk along a rotation direction of the photoconductor Pk.

Similarly, chargers CCy, CCm, CCc, and CCo, exposure devices LPHy, LPHm, LPHc, and LPHo, developing devices Gy, Gm, Gc, and Go, primary transfer rolls T1y, T1m, T1c, and T1o, and photoconductor cleaners CLy, CLm, CLc, and CLo are respectively arranged around the other photoconductors Py, Pm, Pc, and Po.

Toner cartridges Ky, Km, Kc, Kk, and Ko as examples of developer accommodating units are detachably supported at an upper portion of the marking unit U1a. The toner cartridges Ky to Ko accommodate developers to be replenished to the developing devices Gy to Go.

An intermediate transfer belt B as an example of an intermediate transfer unit and an example of an image carrying unit is arranged below the photoconductors Py to Po. The intermediate transfer belt B is sandwiched between the photoconductors Py to Po and the primary transfer rolls T1y to T1o. A back surface of the intermediate transfer belt B is supported by a drive roll Rd as an example of a driving unit, a tension roll Rt as an example of a tension applying unit, a walking roll Rw as an example of a meandering preventing unit, plural idler rolls Rf as examples of a follower unit, a backup roll T2a as an example of a facing unit for secondary transfer, plural retracting rolls R1 as examples of a movable unit, and the primary transfer rolls T1y to T1o.

On a surface of the intermediate transfer belt B, a belt cleaner CLB as an example of a cleaning unit for the intermediate transfer unit is arranged in vicinity of the drive roll Rd.

A secondary transfer roll T2b as an example of a secondary transfer member is arranged to face the backup roll T2a with the intermediate transfer belt B interposed therebetween. A contact roll T2c as an example of a contact unit is in contact with the backup roll T2a in order to apply a voltage having a polarity opposite to a charging polarity of the developer to the backup roll T2a.

The backup roll T2a, the secondary transfer roll T2b and the contact roll T2c constitute a secondary transfer device T2 as an example of a secondary transfer unit according to the exemplary embodiment, and the primary transfer rolls T1y to T1o, the intermediate transfer belt B, the secondary transfer device T2 and the like constitute transfer devices T1, B, and T2 as examples of a transfer unit according to the exemplary embodiment.

A sheet feeding tray TR1 as an example of an accommodating unit is provided below the secondary transfer device T2. The sheet feeding tray TR1 accommodates a recording sheet S as an example of a medium. A pickup roll Rp as an example of a pickup unit, and a retard roll Rs as an example of a retard unit are arranged diagonally above and to the right of the sheet feeding tray TR1. A transport path SH along which the recording sheet S is transported extends from the retard roll Rs. Plural transport rolls Ra as examples of a transport unit that transports the recording sheet S to a downstream side are arranged along the transport path SH.

A deburring device Bt as an example of an unnecessary portion removing unit is arranged downstream of the retard roll Rs. The deburring device Bt sandwiches the recording sheet S at a preset pressure and transports the recording sheet S to the downstream side to remove unnecessary portions at an edge of the recording sheet S, that is, to perform so-called deburring.

A multi-feed detection device Jk is arranged downstream of the deburring device Bt. The multi-feed detection device Jk measures a thickness of the passing recording sheet S, and detects a state in which plural recording sheets S are overlaped, that is, so-called multi-feed.

A correction roll Rc as an example of a posture correction unit is arranged downstream of the multi-feed detection device Jk. The correction roll Rc corrects an inclination of the recording sheet S with respect to the transport direction, that is, so-called skew.

A registration roll Rr as an example of an adjusting unit that adjusts a transport timing of the recording sheet S to the secondary transfer device T2 is arranged downstream of the correction roll Rc. A sheet guide SG1 as an example of a medium guiding unit is arranged downstream of the registration roll Rr.

In the feeder unit U2, sheet feeding trays TR2, TR3 and the like configured similarly to the sheet feeding tray TR1, the pickup roll Rp, the retard roll Rs and the transport roll Ra are provided, and the transport path SH from the sheet feeding tray TR2 or TR3 joins the transport path SH of the printer body U1 upstream of the multi-feed detection device Jk.

Plural transport belts HB as examples of a medium transport unit are arranged downstream of the secondary transfer roll T2b in the transport direction of the recording sheet S.

A fixing device F as an example of a fixing unit is arranged downstream of the transport belt HB in the transport direction of the recording sheet S.

A decurler Hd as an example of a decurling unit is arranged in the finisher U3 downstream of the fixing device F. The decurler Hd applies a pressure to the recording sheet S to correct curving, so-called curling, of the recording sheet S.

The transport path SH extends downstream of the decurler Hd toward a discharge tray TRh as an example of a loading unit. A discharge roll Rh as an example of a discharge unit is arranged at a downstream end of the transport path SH.

An inverting path SH2 as an example of a transport path that branches from the transport path SH is formed downstream of the decurler Hd. A first gate GT1 as an example of a transport direction switching unit is arranged at a branching portion between the transport path SH and the inverting path SH2.

Plural switchback rolls Rb as examples of a transport unit capable of normal and reverse rotation are arranged in the inverting path SH2. A connection path SH3 as an example of a transport path that branches from an upstream portion of the inverting path SH2 and joins the transport path SH on a downstream side of the branching portion between the transport path SH and the inverting path SH2, is formed upstream of the switchback rolls Rb. A second gate GT2 as an example of a transport direction switching unit is arranged at a branching portion between the inverting path SH2 and the connection path SH3.

A return path SH4 that inverts, that is, switches back the transport direction of the recording sheet S, is arranged downstream of the inverting path SH2 below the fixing device F. The switchback roll Rb as an example of a transport unit capable of normal and reverse rotation is arranged in the return path SH4. A third gate GT3 as an example of a transport direction switching unit is arranged at an inlet of the return path SH4.

The transport path SH downstream of the return path SH4 joins the transport path SH of the sheet feeding tray TR1.

(Marking Operation)

In the printer U, when image information transmitted from the personal computer PC is received via the print image server COM, a job serving as an image forming operation is started. When the job is started, the photoconductors Py to Po, the intermediate transfer belt B and the like rotate.

The photoconductors Py to Po are driven to rotate by a drive source (not shown).

A preset voltage is applied to the chargers CCy to CCo to charge surfaces of the photoconductors Py to Po.

The exposure devices LPHy to LPHo as examples of a latent image forming device and examples of a light emitting device output light Ly, Lm, Lc, Lk, and Lo for writing latent images in response to a control signal from the controller C to write electrostatic latent images on the charged surfaces of the photoconductors Py to Po.

The developing devices Gy to Go develop the electrostatic latent images on the surfaces of the photoconductors Py to Po.

The toner cartridges Ky to Ko replenish developers consumed during the development in the developing devices Gy to Go.

A primary transfer voltage having a polarity opposite to the charging polarity of the developer is applied to the primary transfer rolls T1y to T1o, and visible images on the surfaces of the photoconductors Py to Po are transferred to the surface of the intermediate transfer belt B.

The photoconductor cleaners CLy to CLo remove and clean the developer remaining on the surfaces of the photoconductors Py to Po after a primary transfer.

When the intermediate transfer belt B passes through a primary transfer region facing the photoconductors Py to Po, images are transferred and stacked in the order of O, Y, M, C, and K, and then the intermediate transfer belt B passes through a secondary transfer region Q4 facing the secondary transfer device T2. In a case of a monochromatic image, an image of only one color is transferred and sent to the secondary transfer region Q4.

The pickup roll Rp feeds the recording sheet S from the sheet feeding trays TR1 to TR3 from which the recording sheet S is supplied, depending on a size of the received image information, designation of the recording sheet S, and a size, kind or the like of the accommodated recording sheet S.

The retard rolls Rs separates and loosens the recording sheets S fed from the pickup roll Rp one by one.

The deburring device Bt applies the preset pressure to the passing recording sheet S to remove burrs.

The multi-feed detection device k detects the multi-feed of the recording sheets S by detecting the thickness of the recording sheets S passing through the multi-feed detection device Jk.

The correction roll Rc corrects the skew by bringing the passing recording sheet S into contact with a wall surface (not shown).

The registration roll Rr feeds the recording sheet S in accordance with a timing when the image on the surface of the intermediate transfer belt B is sent to the secondary transfer region Q4.

The sheet guide SG1 guides the recording sheet S fed by the registration roll Rr to the secondary transfer region Q4.

In the secondary transfer device T2, a secondary transfer voltage having a polarity the same as the preset charging polarity of the developer is applied to the backup roll T2a via the contact roll T2c, and the image on the intermediate transfer belt B is transferred to the recording sheet S.

The belt cleaner CLB removes and cleans the developer remaining on the surface of the intermediate transfer belt B after the image is transferred in the secondary transfer region Q4.

The transport belt HB holds the recording sheet S having the image transferred by the secondary transfer device T2 on a surface thereof and transports the recording sheet S to the downstream side.

The fixing device F includes a heating roll Fh as an example of a heating member, and a pressure roll Fp as an example of a pressure member. A heater h as an example of a heat source is accommodated inside the heating roll Fh. The fixing device F fixes an unfixed image on the surface of the recording sheet S by heating it while pressing the recording sheet S passing through a fixing region Q5 where the heating roll Fh and the pressure roll Fp are in contact with each other. The heating roll Fh and the pressure roll Fp constitute fixing device F according to the exemplary embodiment.

The decurler Hd applies a pressure to the recording sheet S passed through the fixing device F to remove curving, so-called curling, of the recording sheet S.

When duplex printing is performed, the recording sheet S passed through the decurler Hd is transported to the inverting path SH2 by an operation of the first gate GT1, and the recording sheet S is switched back in the return path SH4 and is retransmitted to the registration roll Rr through the transport path SH, and then the second side is printed.

In a case where the recording sheet S discharged to the discharge tray TRh is discharged in a state where a surface on which the image is recorded is facing up, that is, in a case of so-called face-up discharge, the recording sheet S is transported along the transport path SH and is discharged to the discharge tray TRh by the discharge roll Rh.

On the other hand, in a case where the recording sheet S is discharged in a state where the surface on which the image is recorded is facing down, that is, in a case of so-called face-down discharge, the recording sheet S is temporarily transported from the transport path SH to the inverting path SH2. Then, after a trailing end of the recording sheet S in the transport direction passes through the second gate GT2, the normal rotation of the switchback roll Rb is stopped. Then, the second gate GT2 is switched, the switchback roll Rb is reversely rotated, and the recording sheet S is transported along the connection path SH3 to the discharge tray TRh.

The discharged recording sheets S are loaded on the discharge tray TRh.

(Description of Latent Image Forming Device)

In the exemplary embodiment, as the exposure devices (print heads) LPHy to LPHo, a recording device using an LED print head (LPH) in which plural light emitting diodes (LEDs) are arranged in a main scanning direction to form a light emitting element array is employed in response to a demand for miniaturization of the device.

In a light emitting chip in which plural light emitting elements are provided in a row on a substrate and a self-scanning light emitting element array (SLED) in which lighting is controlled sequentially is mounted, a light emitting thyristor coupled in series to a light emitting diode is used. The thyristor is an element that has an anode, a cathode and at least one gate, is turned on when a voltage is applied between the anode and the cathode in a state in which a voltage equal to or higher than a certain voltage is applied to the gate, and is maintained in an on-state while a current equal to or higher than a holding current flows between the anode and the cathode.

Figure 2:
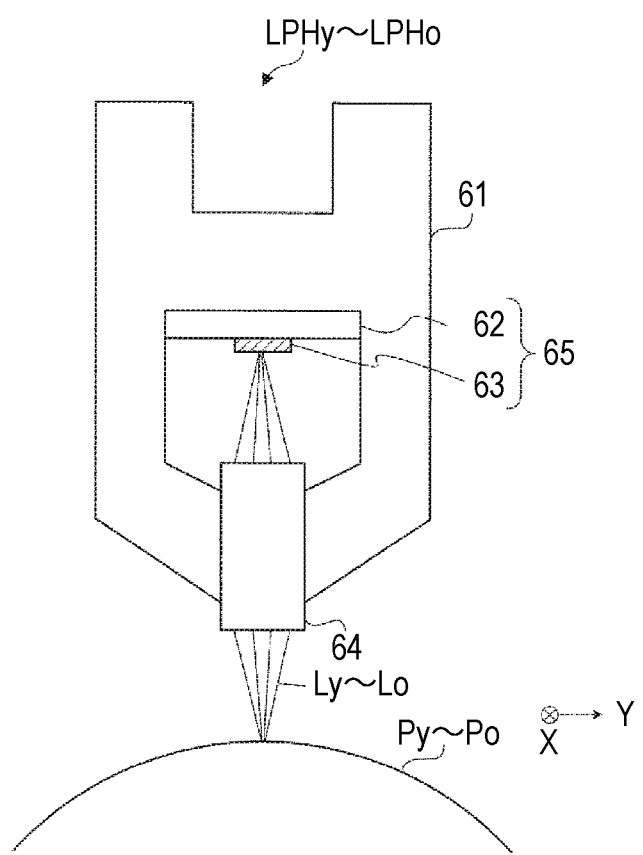
FIG. 2 is a cross-sectional view of a latent image forming device according to the exemplary embodiment.

FIG. 2 is a cross-sectional view of the latent image forming device according to the exemplary embodiment.

Figure 3:
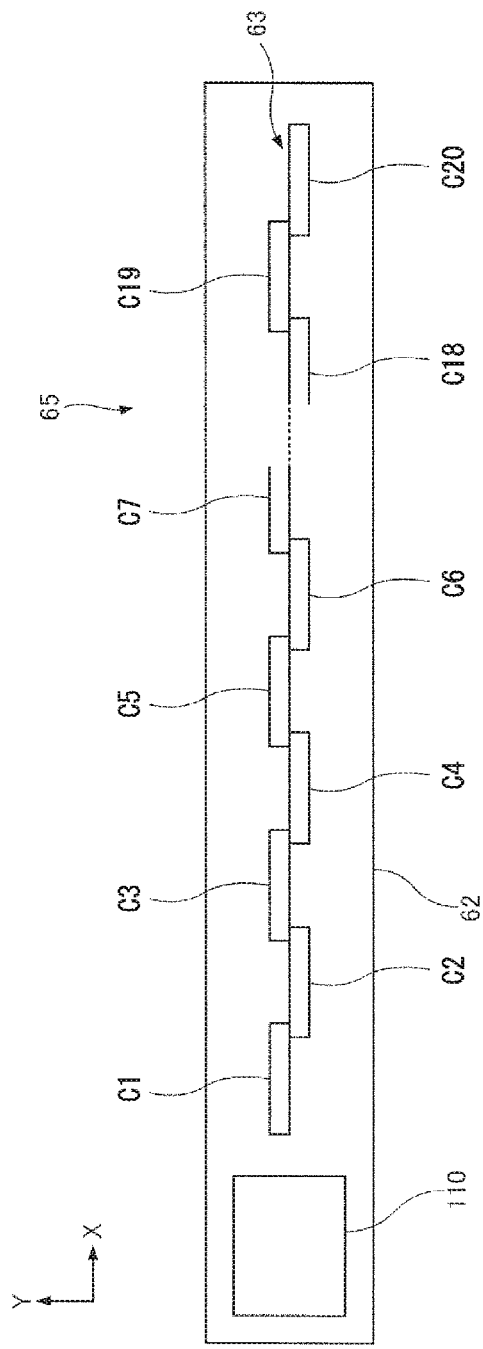
FIG. 3 is a top view of light emitting units according to the exemplary embodiment.

FIG. 3 is a top view of light emitting units according to the exemplary embodiment.

FIG. 2 is a cross-sectional view showing a configuration of the print heads LPHy to LPHo as an example of a light emitting element substrate. The print heads LPHy to LPHo each include a housing 61 as an example of a frame body, a light emitting device 65 as an example of a light emitting unit body, and a rod lens array 64 as an example of an optical unit. The light emitting device 65 includes a light source unit 63 having plural light emitting elements. The rod lens array 64 exposes the photoconductors Py to Po by forming an image with light emitted from the light source unit 63 on the surfaces of the photoconductors Py to Po.

The light emitting device 65 includes a circuit board 62 on which the light source unit 63, a signal generating circuit 110 that drives the light source unit 63 (see FIG. 3), and the like are mounted.

The housing 61 is, for example, made of metal(s), supports the circuit board 62 and the rod lens array 64, and is configured such that a light emitting surface that is a surface of the light source unit 63 that emits the light from the light emitting element is a focal plane of the rod lens array 64. The rod lens array 64 is arranged along an axial direction (a main scanning direction) of the photoconductors Py to Po.

(Light Emitting Device 65)

In FIG. 3, the light source unit 63 includes twenty light emitting chips C1 to C20, as an example of a laminated substrate, on the circuit board 62. The light emitting chips C1 to C20 are arranged in two rows in a staggered manner in an X direction that is the main scanning direction.

In the exemplary embodiment, twenty light emitting chips Ck (C1 to C20) in total are used, but the number is not limited to this and may be appropriately changed depending on a design or specifications.

The light emitting device 65 includes the signal generating circuit 110 that drives the light source unit 63. The signal generating circuit 110 includes, for example, an integrated circuit (IC). The signal generating circuit 110 may not be mounted on the light emitting device 65. In this case, the signal generating circuit 110 is provided outside the light emitting device 65, and supplies a control signal or the like for controlling the light emitting chips C1 to C20 via a cable or the like. Here, the light emitting device 65 is described as including the signal generating circuit 110.

Figure 4:
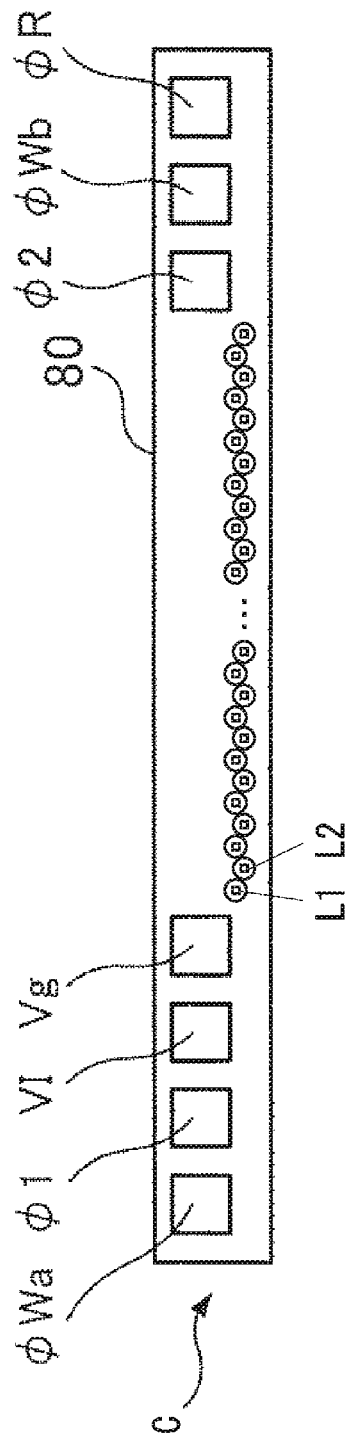
FIG. 4 is an explanatory view of a configuration of a light emitting chip according to the exemplary embodiment.

FIG. 4 is an explanatory view of a configuration of the light emitting chip according to the exemplary embodiment.

Figure 5:
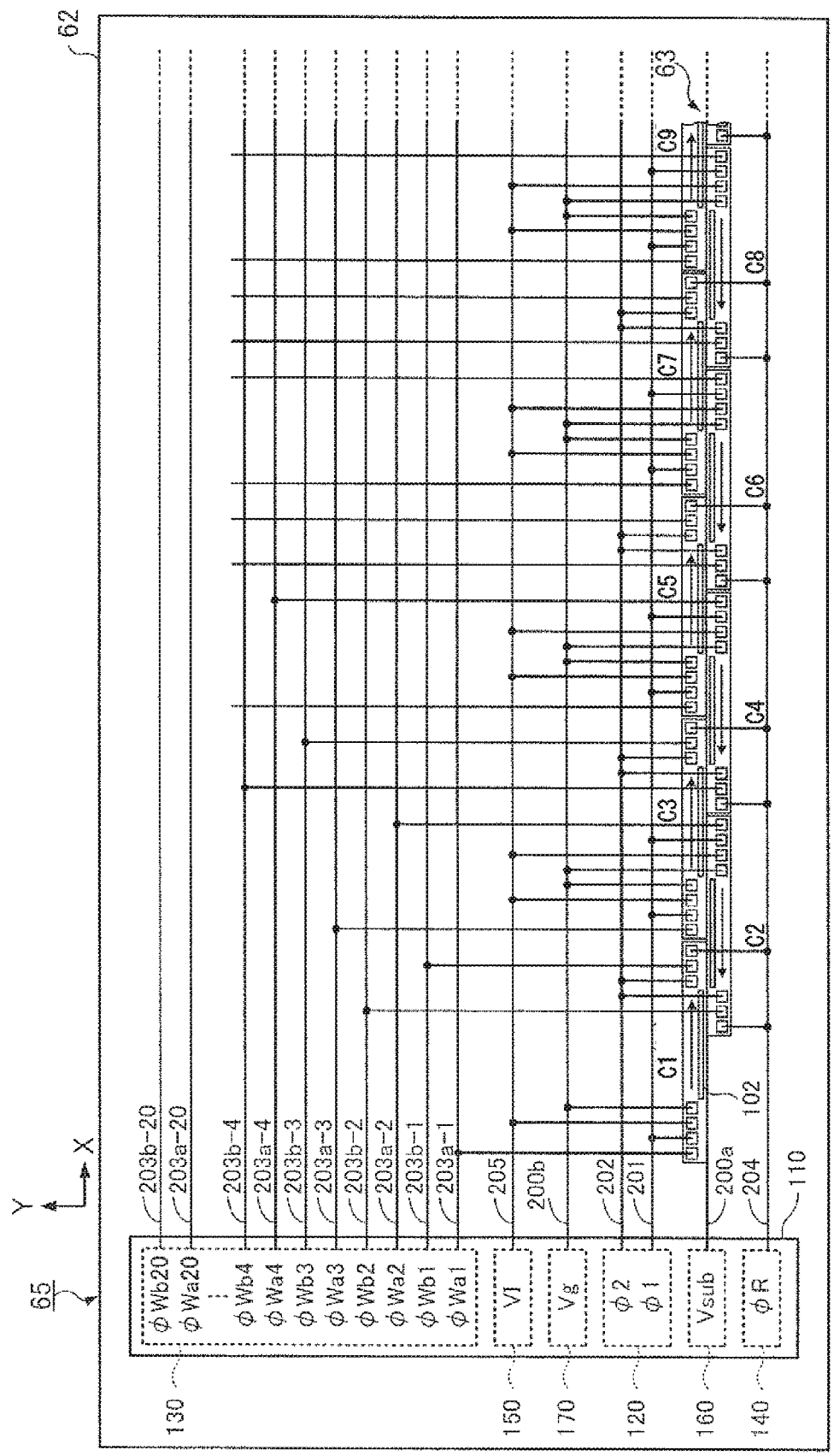
FIG. 5 is an explanatory diagram of a configuration of a signal generating circuit and a configuration of wirings (lines) on a circuit board according to the exemplary embodiment.

FIG. 5 is an explanatory diagram of a configuration of the signal generating circuit and a configuration of wirings (lines) on the circuit board according to the exemplary embodiment.

In FIG. 4, the light emitting chip Ck includes, for example, a semiconductor laminated body provided on a semiconductor substrate 80 having a rectangular surface shape. On a surface of the substrate 80, plural light emitting elements (in the exemplary embodiment, light emitting thyristors L1, L2, L3 and the like) are arranged along the long side in a staggered manner.

In the exemplary embodiment, the light emitting thyristors L1 to L20 include plural first light emitting units (first light emitting thyristors) L1, L3, L5, . . . , and L19 arranged at interval P along a main scanning direction that is a predetermined first direction, and plural second light emitting units (second light emitting thyristors) L2, L4, L6, . . . , and L20 arranged at interval P along the main scanning direction. The second light emitting thyristors L2, L4, . . . , and L20 that are the light emitting units in the exemplary embodiment are arranged at positions deviated from those of the first light emitting thyristors L1, L3, . . . , and L19 with respect to a sub-scanning direction (an example of a second direction) intersecting the main scanning direction, and are arranged at the positions deviated by P/2 from those of L1, L3, . . . , and L19 along the main scanning direction.

Hereinafter, when n is a natural number, the first light emitting thyristors L1, L3, . . . , and L19 may be referred to as "first light emitting thyristors L2$n$−1", and the second light emitting thyristors L2, L4, . . . , and L20 may be referred to as "second light emitting thyristors L2$n$".

In the exemplary embodiment, the light emitting thyristors L1 to L20 are arranged in two rows, but may be arranged in at least three rows. The number of light emitting thyristors is not limited to 20, and may be freely changed depending on the design, specifications or the like.

In FIGS. 4 and 5, the light emitting chip Ck includes terminals (a φ1 terminal, a φ2 terminal, a Vg terminal, a VI terminal, a φWa terminal, a φWb terminal and a φR terminal) that are plural bonding pads that take in various control signals and the like, at both end portions of the surface of the substrate 80 in a long side direction. These terminals are provided in the order of the φWa terminal, the φ1 terminal, the VI terminal and the Vg terminal from one end portion of the substrate 80, and are provided in the order of the φR terminal, the φWb terminal and the φ2 terminal from the other end portion of the substrate 80. The light emitting portion 102 is provided between the Vg terminal and the φ2 terminal. A back surface electrode (not shown) is provided as a Vsub terminal on a back surface of the substrate 80.

Since various control signals and terminals are common in the related art as described in, for example, JP-A-2020-049720, detailed description thereof is omitted.

(Light Emitting Chip Ck)

Figure 6:
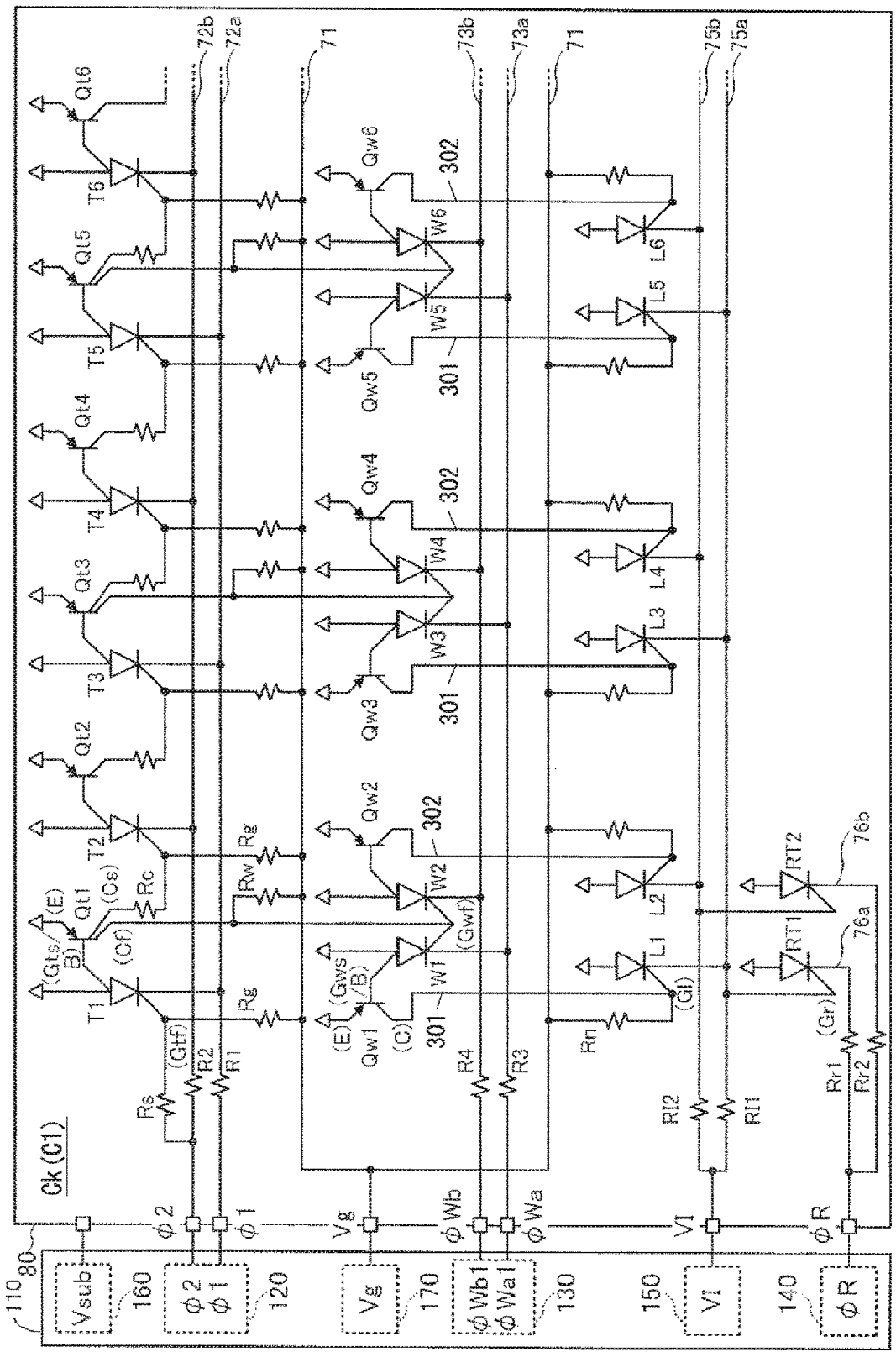
FIG. 6 is an example of an equivalent circuit diagram showing a configuration of the light emitting chip according to the exemplary embodiment.

FIG. 6 is an example of an equivalent circuit diagram showing a configuration of the light emitting chip according to the exemplary embodiment.

In FIG. 6, each element described below is represented by a widely used circuit symbol. Positions of the terminals (the φ1 terminal, the φ2 terminal, the φWa terminal, the φR terminal, the VI terminal and the Vg terminal) are different from those in FIG. 4, but are shown at a left end in the drawing for convenience of description. The Vsub terminal is provided as a back surface electrode on the back surface of the substrate 80.

Here, the light emitting chip Ck is described by taking the light emitting chip C1 as an example in relation to the signal generating circuit 110, and description of the other light emitting chips C2 to C20 is omitted.

The light emitting chip Ck includes the light emitting thyristors L1, L2, L3 and the like, transfer thyristors T1, T2, T3 and the like, coupling transistors Qt1, Qt2, Qt3 and the like, set thyristors W1, W2, W3 and the like, and setting transistors Qw1, Qw2, Qw3 and the like.

When the light emitting thyristors L1, L2, L3 and the like are handled as being not distinguished from each other, the light emitting thyristors L1, L2, L3 and the like are referred to as light emitting thyristors L. The same applies to the other components. Transfer thyristors T, coupling transistors Qt, set thyristors W and setting transistors Qw are arranged along the arrangement of the light emitting thyristors L (FIG. 4).

The transfer thyristor T is an example of a transfer element, and the set thyristor W is an example of a setting element. In the exemplary embodiment, the light emitting thyristors L, resistors RI1 and RI2, and a resistor Rn constitute a light emitting device.

The light emitting chip Ck includes light-off thyristors RT1 and RT2. When the light-off thyristors RT1 and RT2 are handled as being not distinguished from each other, the light-off thyristors RT1 and RT2 are referred to as light-off thyristors RT.

The light emitting chip Ck includes plural resistors. The resistors are not numbered for being distinguished from each other, unlike the light emitting thyristors L1, L2, L3 and the like.

The light emitting thyristor L, the transfer thyristor T, the set thyristor W and the light-off thyristor RT are thyristors each having a pnpn structure. As shown in the transfer thyristor T1, the transfer thyristor T is a four-terminal element having an anode, a first gate Gtf, a second gate Gts and a cathode. In FIG. 6, the first gate Gtf is denoted as (Gtf). The same applies to the other components. Other equivalent elements are not denoted by reference numerals. The same applies to the other components.

As shown in the set thyristor W1, the set thyristor W is a four-terminal element having an anode, a first gate Gwf, a second gate Gws and a cathode. On the other hand, as shown in the light emitting thyristor L1, the light emitting thyristor L is a three-terminal element having an anode, a gate G1 and a cathode. Similarly, as shown in the light-off thyristor RT1, the light-off thyristor RT is a three-terminal element having an anode, a gate Gr and a cathode.

The coupling transistor Qt and the setting transistor Qw are pnp bipolar transistors. As shown in the coupling transistor Qt1, the odd-numbered coupling transistor Qt is a four-terminal element having an emitter E, a base B, a first collector Cf and a second collector Cs. As shown in the coupling transistor Qt2, the even-numbered coupling transistor Qt is a three-terminal element having an emitter E, a base B and a collector C. That is, the odd-numbered coupling transistor Qt is a multi-collector, and the even-numbered coupling transistor Qt is a single collector.

As shown in the setting transistor Qw1, the setting transistor Qw is a three-terminal element having an emitter E, a base B and a collector C. Therefore, the setting transistor Qw is also a single collector.

Then, the light emitting chip Ck includes plural wirings that connects the above elements.

The light emitting chip Ck includes a power supply line 71 connected to the Vg terminal. A power supply voltage Vg is supplied from a power supply voltage supply unit 170 to the power supply line 71 via the Vg terminal connected by a power supply line 200b.

The light emitting chip Ck includes transfer signal lines 72a and 72b connected to the φ1 terminal and the φ2 terminal via resistors R1 and R2, respectively. Transfer signals φ1 and φ2 are transmitted from a transfer signal generating unit 120 to the φ1 terminal and the φ2 terminal via transfer signal lines 201 and 202, respectively. The light emitting chip Ck includes setting signal lines 73a and 73b connected to the φWa terminal and the φWb terminal via resistors R3 and R4, respectively. Setting signals φWa1 and φWb1 are transmitted from a setting signal generating unit 130 to the φWa terminal and the φWb terminal via setting signal lines 203a-1 and 203b-1, respectively.

The resistors R1, R2, R3, and R4 are current limiting resistors provided to maintain a voltage.

The light emitting chip Ck includes lighting signal lines 75a and 75b connected to the Vl terminal via resistors RI1 and RI2, respectively. A lighting voltage Vl is supplied from a lighting voltage supply unit 150 to the Vl terminal. The lighting signal lines 75a and 75b are examples of a lighting voltage line, and the lighting voltage Vl is an example of a lighting voltage.

The light emitting chip Ck includes light-off signal lines 76a and 76b connected to the φR terminal via resistors Rr1 and Rr2, respectively. A light-off signal φR is transmitted from a light-off signal generating unit 140 to the φR terminal via a light-off signal line 204.

The light emitting chip Ck includes the Vsub terminal on a back surface of the substrate 80. A reference voltage Vsub is supplied from a reference voltage supply unit 160 to the Vsub terminal via a power supply line 200a. The Vsub terminal is an example of a reference voltage line.

FIGS. 7A to 7D are explanatory views of the light emitting chip according to the exemplary embodiment, and FIG. 7A is a plan view thereof, FIG. 7B is a cross-sectional view taken along a line VIIB-VIIB in FIG. 7A, FIG. 7C is a cross-sectional view taken along a line VIIC-VIIC in FIG. 7A, and FIG. 7D is a cross-sectional view taken along a line VIID-VIID in FIG. 7A.

In FIG. 7A, in the light emitting chip Ck according to the exemplary embodiment, first wirings 301 extending from collectors (C) of first setting transistors (examples of a first control element) Qw1, Qw3 and the like are connected to first light emitting thyristors L1, L3, . . . , and L19, respectively. Second wirings 302 extending from collectors (C) of second setting transistors (examples of a second control element) Qw2, Qw4 and the like are connected to second light emitting thyristors L2, L4, . . . , and L20, respectively.

In FIG. 7B, the first wiring 301 is formed by being laminated on the substrate 80. An insulating layer 303 is further laminated on a surface side of the first wiring 301. That is, the first wiring 301 is configured to supply a current inside the lamination.

In FIG. 7C, a part of the second wiring 302 is made of a metal material laminated on a surface of the insulating layer 303 laminated on the substrate 80, and supplies a current to the second light emitting thyristor L2n. As shown in FIG. 7D, the second wiring 302 according to the exemplary embodiment is arranged on the surface side so as to pass between the first light emitting thyristors L2n–1 and cover a part of an outer edge portion of the first light emitting thyristor L2n–1, and is arranged on the surface side with the insulating layer 303 interposed therebetween so as not to energize an electrode portion 304 of the outer edge portion of the first light emitting thyristor L2n–1.

FIGS. 8A and 8B are explanatory views of a circuit according to the exemplary embodiment, and FIG. 8A is an explanatory view of a laminated structure of a first wiring portion, and FIG. 8B is an explanatory view of a laminated structure of a second wiring portion. FIG. 8A shows a case where a metal wiring is laminated on a gate semiconductor, and FIG. 8B shows a case where a metal wiring is laminated on an insulating layer.

In FIG. 8A, the setting transistor Qw has a so-called pnp type transistor structure in which a p-type semiconductor 211 functioning as an emitter, an n-type semiconductor 212 functioning as a base, and a p-type semiconductor (a first layer) 213 functioning as a collector are laminated on or above the surface of the conductive substrate 80, and metal first wirings 301 and 302 are laminated on a surface of the p-type semiconductor 213.

On the other hand, in FIG. 8B, the second wiring 302 has a structure in which the insulating layer 303 is laminated on the surface of the substrate 80 and the second wiring 302 is laminated on the surface of the insulating layer (a second layer) 303 in a portion where the second wiring 302 passes between the first light emitting thyristors L2n–1.

(Description of Method for Manufacturing Circuit)

FIGS. 9A and 9B are explanatory views of a method for manufacturing a laminated substrate, and FIG. 9A is an explanatory view of a substrate including no mesa portion before etching, and FIG. 9B is an explanatory view of the substrate in FIG. 9A after etching.

A semiconductor multilayer film (not shown) having a pnpn structure or the like is formed on a surface side of a semiconductor substrate 02, and an active element such as a transistor or a thyristor is formed by processing the semiconductor multilayer film by etching or the like.

In FIGS. 9A and 9B, as an example of the method for manufacturing a circuit board in the related art, in a case of manufacturing a laminated substrate 01, after an insulating film layer 03 and a wiring layer 04 are formed on or above a surface of the semiconductor substrate 02, a resist pattern 07 is formed according to a shape of a wiring 06, and etching (wet etching) is performed with an etchant, so that a portion of the wiring 06 remains as shown in FIG. 9B. In this case, since the liquid etchant erodes the wiring layer 04 inward as compared with an end portion of the resist pattern 07, the resist pattern 07 is formed to have a shape slightly larger than the shape of the target wiring 06 in consideration of the erosion in the related art.

Figure 10A:
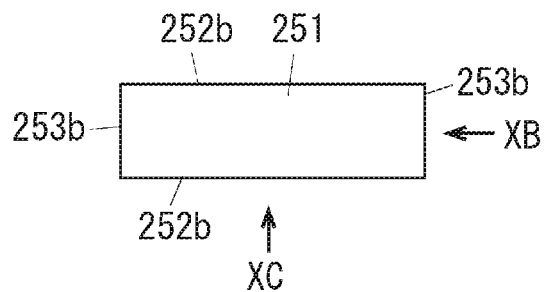
FIGS. 10A to 10C are explanatory views of a laminated substrate having a mesa shape.
Figure 10B:
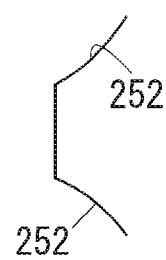
Figure 10C:
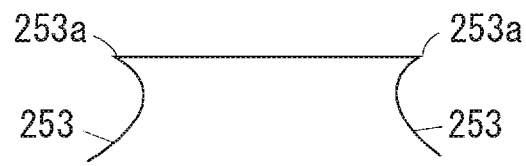

FIGS. 10A to 10C are explanatory views of a laminated substrate having a mesa shape, and FIG. 10A is a plan view thereof, FIG. 10B is a view seen from a direction of the arrow XB in FIG. 10A, and FIG. 10C is a view seen from a direction of the arrow XC in FIG. 10A.

In FIGS. 10A to 10C, in the related art, when a portion to be the light emitting thyristor L is formed as in the light emitting chip Ck according to the exemplary embodiment, a mesa portion 251 having a substantially trapezoidal cross-sectional shape is formed, and an insulating film layer, a metal film layer and the like are laminated. When the mesa portion 251 is formed by wet etching, a forward mesa (a first inclined surface) 252 whose top portion is not eaves-shaped as shown in FIG. 10B, and an inverted mesa (a second inclined surface) 253 having an eaves portion (an eaves-shaped portion) 253a at a top portion are generally formed in relation to crystal orientation. In general, the mesa portion having a trapezoidal cross-sectional shape is not limited to a geometrically precise trapezoidal cross-sectional shape, and encompasses a trapezoidal shape such as a table shape formed by differential erosion that is a so-called mesa.

Figure 11A:
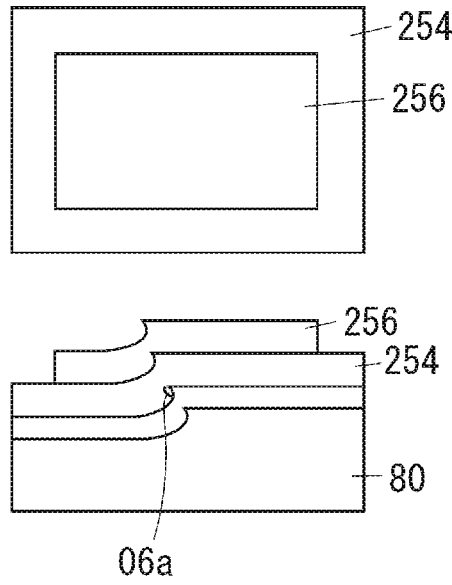
FIGS. 11A and 11B are explanatory views of a case where an inverted mesa portion is etched.
Figure 11B:
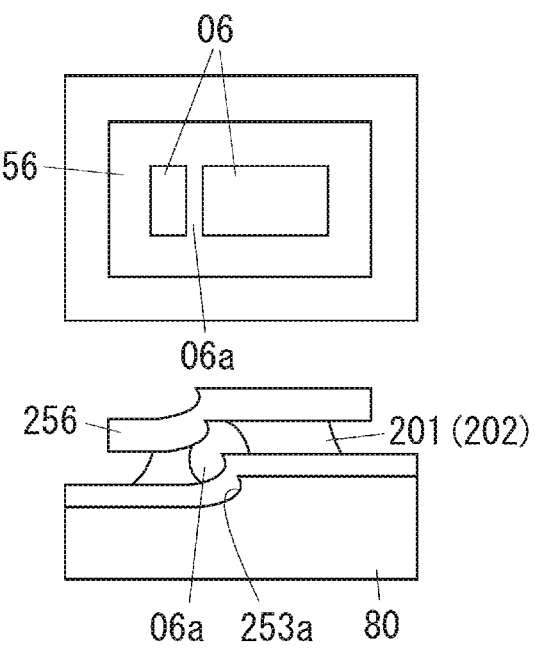

FIGS. 11A and 11B are explanatory views of a case where an inverted mesa portion is etched, and FIG. 11A is an explanatory view of a state where a film is formed on the inverted mesa portion, and FIG. 11B is an explanatory view of a state after etching from the state in FIG. 11A.

In FIG. 11A, when a wiring layer (a metal film) 254 is formed on a surface of a portion of the inverted mesa 253 by a sputtering method or the like, metal particles do not sufficiently reach and adhere to a lower portion (an overhang portion) of the eaves portion 253a, and a thickness of the wiring layer 254 becomes thin or film quality becomes coarse, and a cavity 06a may be further formed. When a resist pattern (a resist layer) 256 is formed in this state and etching is performed, a portion having a thin thickness may be etched more than expected by an etchant, or a cavity may be etched so as to grow largely by the etchant that enters the cavity portion. Therefore, in some cases, as shown in FIG. 11B, a portion of the wiring 06 may be disconnected in the middle.

Figure 12A:
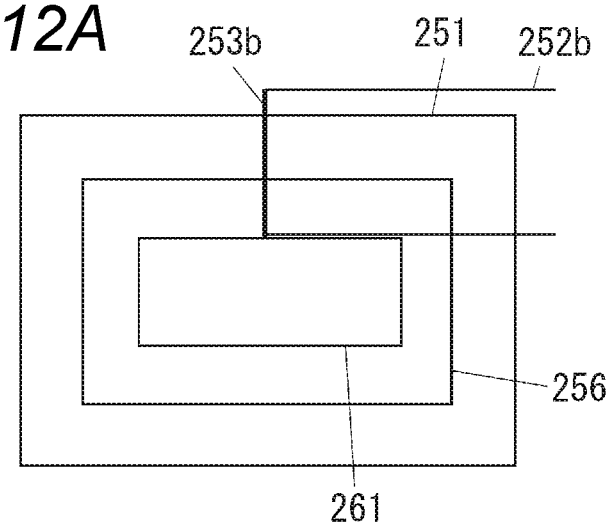
FIGS. 12A to 12C are explanatory views of a case where an inverted mesa portion overlaps with a part of a target shape.
Figure 12B:
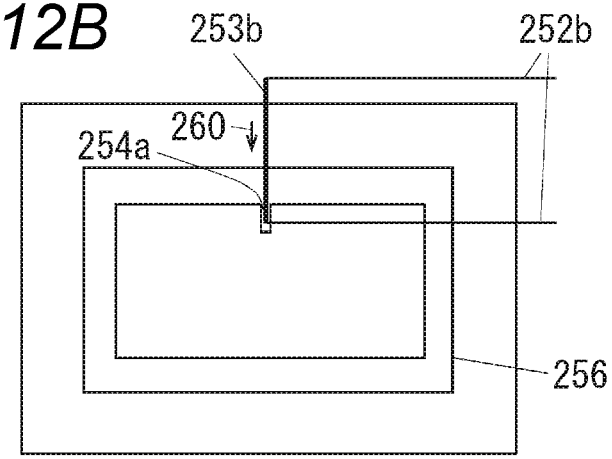
Figure 12C:
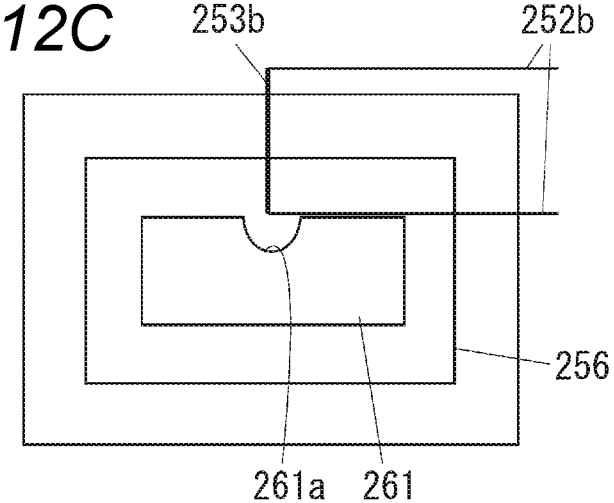

FIGS. 12A to 12C are explanatory views of a case where an inverted mesa portion overlaps with a part of a target shape, and FIG. 12A is an explanatory view of a state before etching, FIG. 12B is an explanatory view of a state after a wiring layer is formed, and FIG. 12C is an explanatory view of a state after etching.

As shown in FIG. 12A, in a case where a line 253b of the eaves portion 253a of the inverted mesa 253 overlaps with a part of a target shape 261 of the wiring layer 254, when a lower portion of the eaves portion 253a is exposed to an etchant after wet etching is started, the etching proceeds at a high speed along the cavity 06a and the like, and as shown in FIG. 12B, a recess 254a may be formed in the wiring layer 254 along the line 253b of the inverted mesa 253. When the etching further proceeds from this state, the etchant is likely to flow in from a side where the resist pattern 256 is not formed (see the arrow 260 in FIG. 12B) along the recess 254a, and the etching proceeds unexpectedly from a portion of the recess 254a, and a portion 261a where metal is etched in a semicircular shape may be formed. When the etched portion 261a is provided, an adverse effect on a lifetime of the wiring, an electric resistance value or the like may occur.

Figure 13:
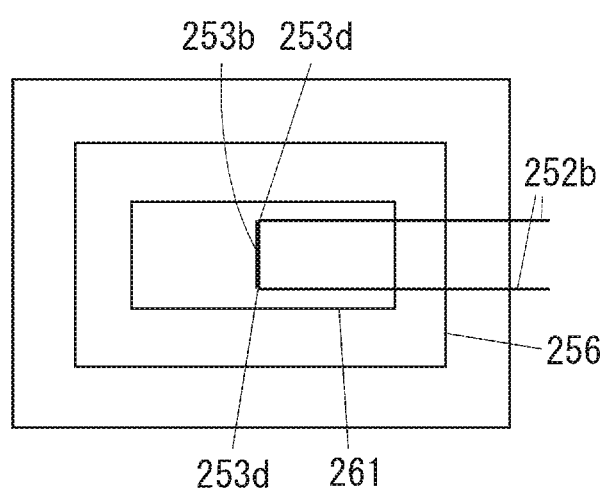
FIG. 13 is an explanatory view of an example of a method for manufacturing the inverted mesa portion according to the exemplary embodiment.

FIG. 13 is an explanatory view of an example of a method for manufacturing the inverted mesa portion according to the exemplary embodiment.

In FIG. 13, in a case of manufacturing the light emitting chip Ck according to the exemplary embodiment, when the target shape 261 corresponding to the wirings 301 and 302 reaches the inverted mesa 253, the target shape 261 to be finally formed is arranged such that a width of the target shape 261 is equal to or larger than a width of the inverted mesa 253 and the target shape 261 covers the whole of the line 253b of the inverted mesa 253.

In this case, both ends 253d along the inverted mesa 253 are covered with the wiring layer 254 in a state before etching, and an etchant is prevented from entering from the both ends 253d. Therefore, the etching may be prevented from proceeding more than expected in the portion of the inverted mesa 253. Therefore, disconnection of the target shape 261 is prevented.

Figure 14A:
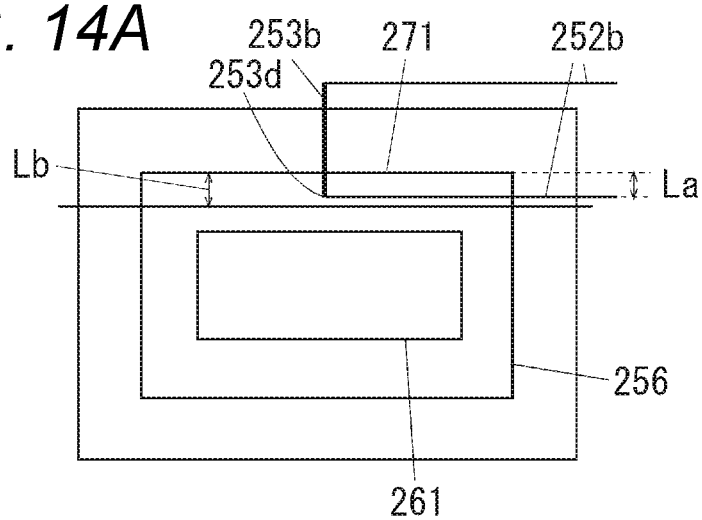
FIGS. 14A to 14C are explanatory views of another example of the method for manufacturing the inverted mesa portion according to the exemplary embodiment.
Figure 14B:
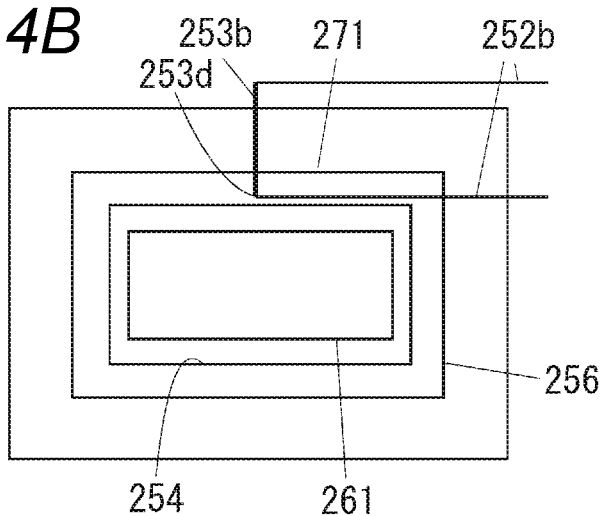
Figure 14C:
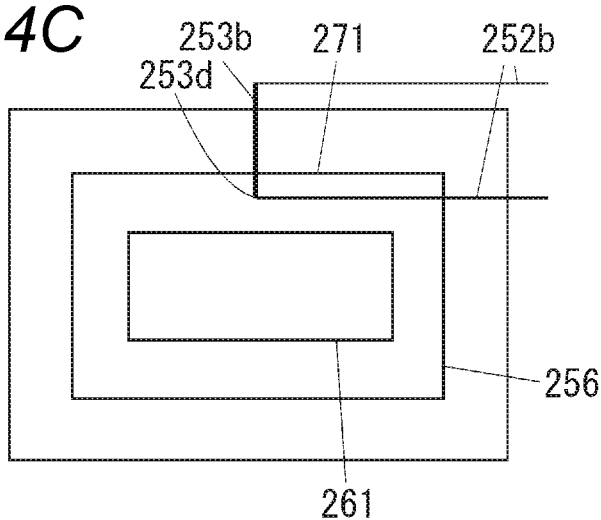

FIGS. 14A to 14C are explanatory views of another example of the method for manufacturing the inverted mesa portion according to the exemplary embodiment, and FIG. 14A is an explanatory view of a state where a wiring layer is formed, FIG. 14B is an explanatory view of a state where etching is progressed by a thickness of the wiring layer, and FIG. 14C is an explanatory view of a state where etching is completed.

When the whole of the inverted mesa line 253b is not covered with the target shape 261 corresponding to the wiring 301 or 302 unlike the case shown in FIG. 13, the target shape 261 is arranged so as to be away from a portion of the inverted mesa line 253b as shown in FIGS. 14A to 14C. In FIGS. 14A to 14C, specifically, the target shape 261 is arranged such that a length La from an outer side 271 of the resist layer 256 to an end 253d of the inverted mesa line 253b (a distance between the wiring and the eaves portion) is shorter than a thickness Lb of the wiring layer 254 (La<Lb). In such a configuration, when etching is started from the state in FIG. 14A, the etching of the wiring layer 254 proceeds in a direction along the inverted mesa line 253b and in a thickness direction. Then, when the etching progresses by the thickness Lb of the wiring layer 254 from an outer side 271 of the resist layer 256, the wiring layer 254 is already etched to a portion beyond the portion of the inverted mesa 253 in a direction along the inverted mesa line 253b, and thereafter, the etching progresses without being affected by the eaves portion 253a. Therefore, when the target shape 261 is arranged as shown in FIGS. 14A to 14C, disconnection of the target shape 261 is prevented.

Figure 15A:
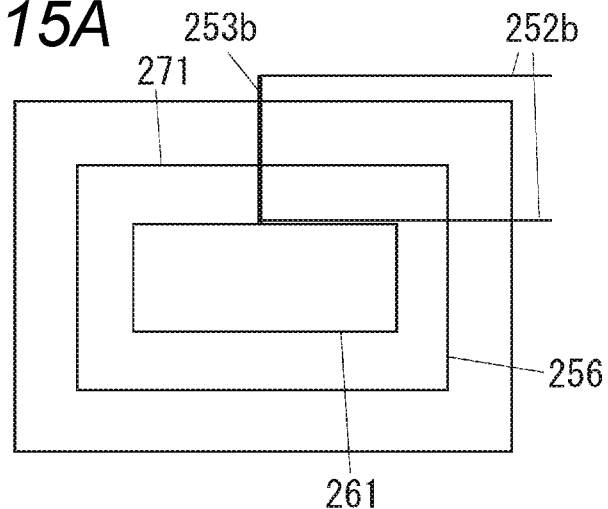
FIGS. 15A and 15B are explanatory views of a state where the wiring and the inverted mesa portion are closer to each other as compared with the state in FIGS. 14A to 14C.
Figure 15B:
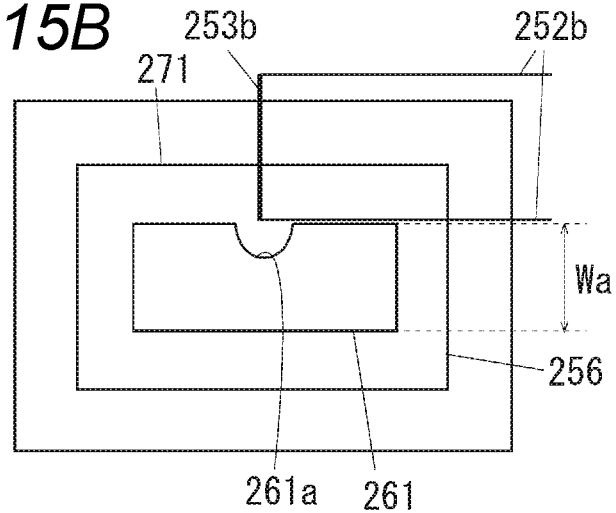

FIGS. 15A and 15B are explanatory views of a state where the wiring and the inverted mesa portion are closer to each other than the state in FIGS. 14A to 14C, and FIG. 15A is an explanatory view of a state before etching in a case where the inverted mesa portion is present on one side of the wiring, and FIG. 15B is an explanatory view of a state after etching in the case where the inverted mesa portion is present on one side of the wiring.

In FIGS. 15A and 15B, in a case where the target shape 261 corresponding to the wiring 301 or 302 is arranged so as to be away from the portion of the inverted mesa line 253b and the target shape 261 is not arranged to satisfy La<Lb, a width Wa of the target shape 261 is set such that the width Wa of the target shape 261 is sufficiently larger than the thickness Lb in the exemplary embodiment. In FIG. 15A, when the inverted mesa line 253b is present on one side of the target shape 261 in a width direction, the width Wa of the target shape 261 is set such that the width Wa is twice the thickness Lb, for example. The width Wa is preferably at least twice the thickness Lb, and more preferably at least three times the thickness Lb. By doing so, even if the portion 261a etched during the etching is formed, the width Wa is twice the thickness Lb, so that the target shape 261 is connected sufficiently without disconnection.

Figure 16A:
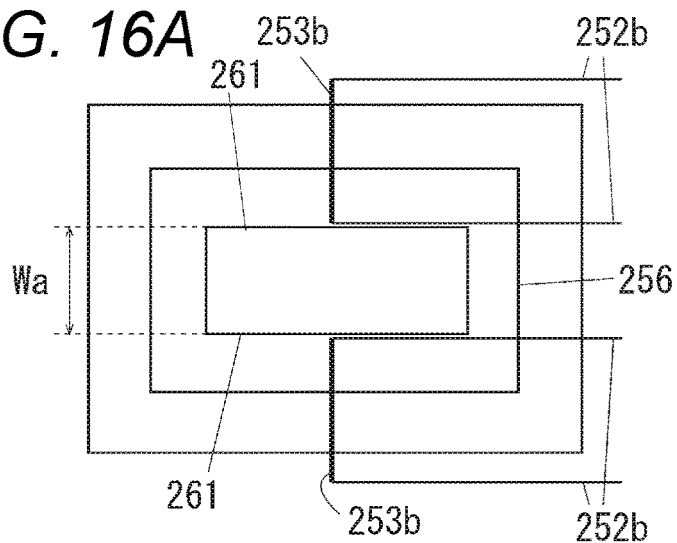
FIGS. 16A and 16B are explanatory views of a state where the wiring and the inverted mesa portion are closer to each other as compared with the state in FIGS. 14A to 14C.
Figure 16B:
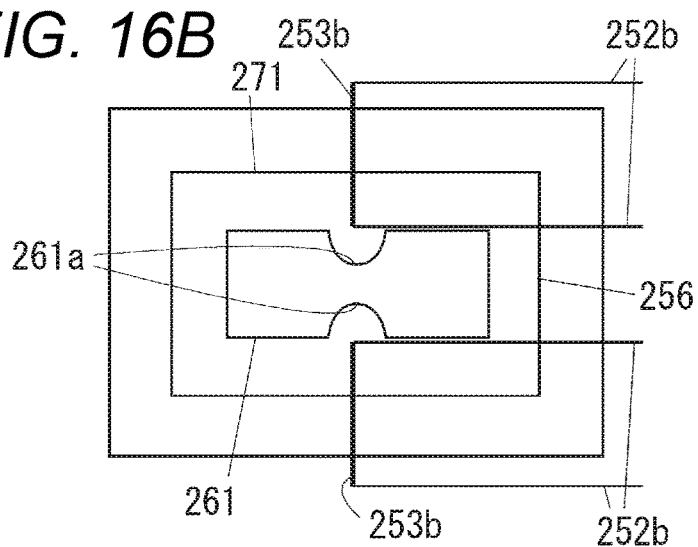

FIGS. 16A and 16B are explanatory views of a state where the wiring and the inverted mesa portion are closer to each other than the state in FIGS. 14A to 14C, and FIG. 16A is an explanatory view of a state before etching in a case where the inverted mesa portions are present on both sides of the wiring, and FIG. 16B is an explanatory view of a state after etching in the case where the inverted mesa portions are present on both sides of the wiring.

In FIGS. 16A and 16B, in a case where "La<Lb" is not satisfied and the inverted mesa lines 253b are present on both sides of the target shape 261 corresponding to the wiring 301 or 302 in the width direction, in the exemplary embodiment, the width Wa of the target shape 261 is set such that the width Wa is three times the thickness Lb, for example. The width Wa is preferably at least three times the thickness Lb, and more preferably at least four times the thickness Lb. By doing so, even if the portion 261a etched during the etching is formed on both sides in the width direction, the width Wa is three times the thickness Lb, so that the target shape 261 is connected sufficiently without disconnection.

Figure 17:
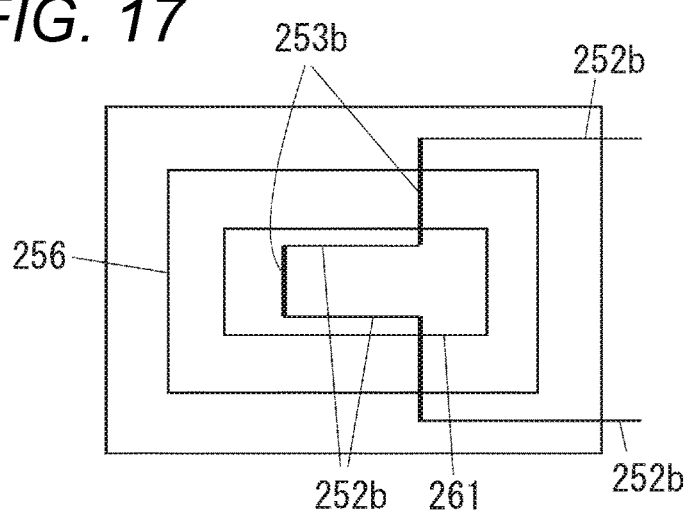
FIG. 17 is an explanatory view of a case where the wiring is not away from the inverted mesa portion and the whole of the inverted mesa portion is not covered with the wiring.

FIG. 17 is an explanatory view of a case where the wiring is not away from the inverted mesa portion and the whole of the inverted mesa portion is not covered with the wiring.

In FIG. 17, in a case where the target shape 261 corresponding to the wiring 301 or 302 is not away from the inverted mesa 253 and the whole of the inverted mesa line 253b is not covered with the target shape 261, in the exemplary embodiment, the target shape 261 is arranged so as to overlap with the inverted mesa 253 and two or more forward mesa lines 252b. Here, the forward mesa line is an upper side of the first inclined surface 252. By arranging the target shape 261 in this way, etching proceeds more than expected in the portion of the inverted mesa 253, but the etching proceeds as expected in the portion of the forward mesa 252, and an etching speed as a whole is slower than that in the case of only the inverted mesa 253. Therefore, disconnection of the target shape 261 is prevented.

Figure 18A:
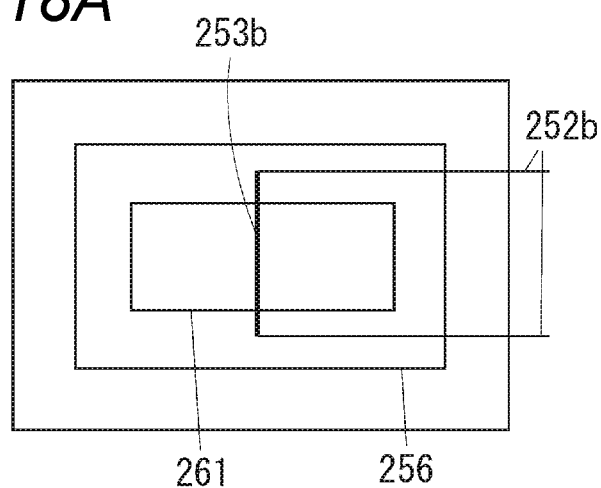
FIGS. 18A and 18B are explanatory views of a case where the wiring is not away from the inverted mesa portion and the whole of the inverted mesa portion is not covered with the wiring, and an end edge is formed oblique with respect to an inverted mesa line.
Figure 18B:
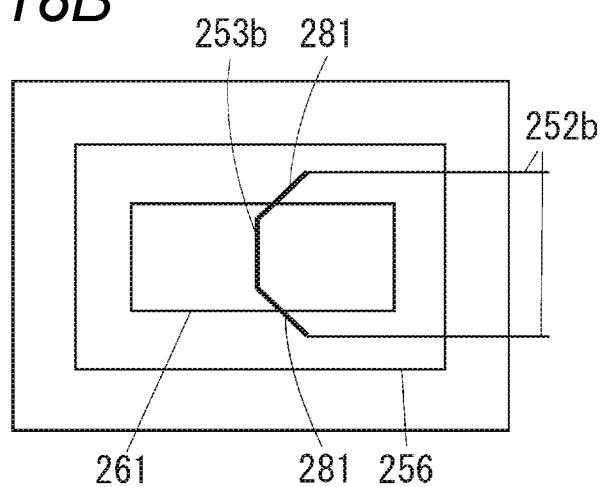

FIGS. 18A and 18B are explanatory views of a case where the wiring is not away from the inverted mesa portion and the whole of the inverted mesa portion is not covered with the wiring, and an end edge is formed oblique with respect to an inverted mesa line, and FIG. 18A is an explanatory view of a state where the oblique end edge is not formed, and FIG. 18B is an explanatory view of a state where the oblique end edge is formed.

In FIGS. 18A and 18B, in a case where the target shape 261 corresponding to the wiring 301 or 302 is not away from the inverted mesa 253 and the whole of the inverted mesa line 253b is not covered with the target shape 261, in the exemplary embodiment, an oblique end edge (an end edge of a top surface extending in an oblique direction) 281 inclined with respect to both the inverted mesa line 253b and the line 252b of the forward mesa 252 is formed in the mesa portion 251. By forming the oblique end edge 281 in this way, the oblique end edge 281 becomes a portion that does not have the eaves portion 253a similarly to the forward mesa 252. As is seen from the comparison between FIGS. 18A and 18B, formation of the oblique end edge 281 shortens a length of the inverted mesa line 253b in FIG. 18B and prevents an adverse effect on etching at the eaves portion 253a.

An inclination angle of the oblique end edge 281 with respect to the inverted mesa line 253b is 45° in FIG. 18B, but is not limited thereto. As a result of an experiment by the present inventor, it is confirmed that an effect of reducing the adverse effect seen in the eaves portion 253a is obtained when the inclination angle is in a range of 10° to 80°. Therefore, the end edge is not limited to a shape of the oblique edge 281 in which a corner is chamfered as shown in FIG. 18B, and may be a curved end edge or an end edge in which an inclination angle changes in a stepwise manner.

(Modifications)

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention defined by the following claims and their equivalents.

Modifications (H01) to (H08) of the exemplary embodiment of the present invention are exemplified below.

(H01) In the above exemplary embodiment, the printer U is exemplified as an example of the image forming device, but the image forming device is not limited thereto, and for example, the image forming device may be configured by a copying machine, a FAX, or a multifunction machine having plural functions of these or all of these functions. The image forming device is not limited to an electrophotographic image forming device, and may be applied to any image forming device such as an inkjet image forming device or a thermal transfer image forming device.

(H02) In the above exemplary embodiment, as the light emitting unit, the structure of the light emitting thyristor is exemplified, but the light emitting unit is not limited thereto. For example, the light emitting unit may be only a light emitting diode. The wiring may also be applied to a configuration in which a current is supplied to each of the light emitting units, for example, a configuration described in JP-A-2020-123603. The present invention is not limited to a configuration of an LED head including a light emitting diode or the like, and may also be applied to a configuration including a laminated substrate such as a vertical cavity surface emitting laser (VCSEL).

(H03) In the above exemplary embodiment, the case where the plural first light emitting thyristors L2$n$−1 and the plural second light emitting thyristors L2$n$ are provided is exemplified, but the present invention is not limited thereto. The present invention may also be applied to a case where one first light emitting thyristor L2$n$−1 and one second light emitting thyristor L2$n$ are provided. In addition, the modifications may be appropriately combined with each other, and for example, by combining the modification (H02) and the modification (H03), the light emitting unit may be configured by VCSELs with one first VCSEL and one second VCSEL.

(H04) In the above exemplary embodiment, the configuration in which one wiring 301 or 302 is provided for one light emitting thyristor L is exemplified, but the present invention is not limited thereto. For example, the present invention may be applied to a configuration in which one wiring is branched and connected to plural light emitting thyristors, and turning-on and turning-off of the plural light emitting thyristors are simultaneously controlled through the one wiring.

(H05) In the above exemplary embodiment, the case where the first control element (a first coupling transistor) and the second control element (a second coupling transistor) are different from each other is exemplified, but the present invention is not limited thereto. For example, the present invention may also be applied to a configuration in which the first control element and the second control element are the same and the same signal is transmitted to each of the first wiring and the second wiring.

Figure 19:
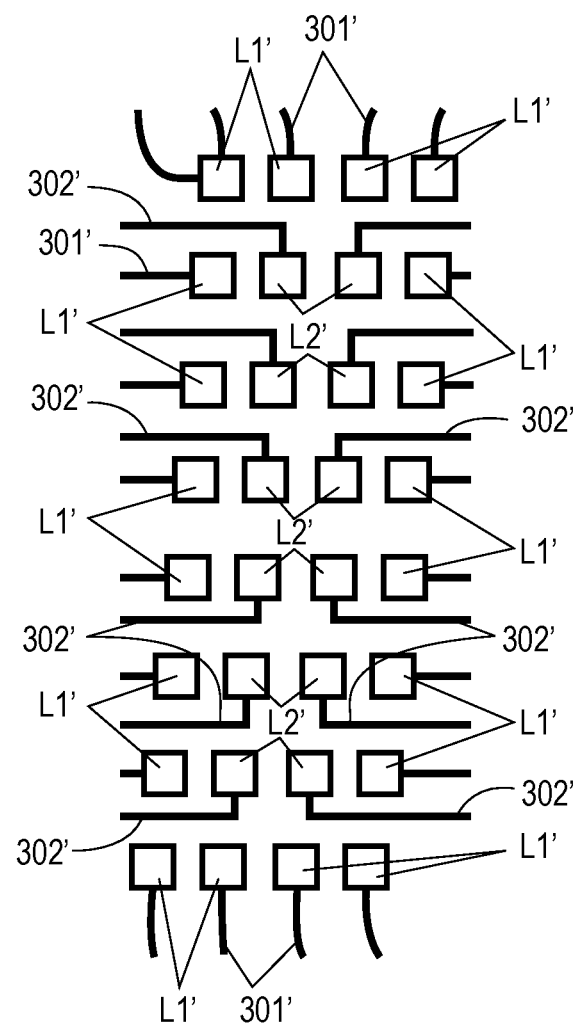
FIG. 19 is an explanatory view of another example of arrangement of the light emitting units according to the exemplary embodiment of the present invention.

FIG. 19 is an explanatory view of another example of arrangement of the light emitting units according to the exemplary embodiment of the present invention.

(H06) The configuration in which the light emitting thyristors L are arranged in the staggered manner as shown in the exemplary embodiment is exemplified, but the present invention is not limited thereto. For example, as shown in FIG. 19, when the light emitting thyristors L are densely arranged in a planar shape rather than in a row shape, the present invention may also be applied to a case where a second wiring 302' to a second light emitting thyristor L2' with respect to a first light emitting thyristor L1' on an outer peripheral side and the second light emitting thyristor L2' on an inner side is arranged so as to pass between the first light emitting thyristors L1' as in the exemplary embodiment.

(H07) In the above exemplary embodiment, the case of the print head used in the image forming device as an application of the light emitting element substrate is exemplified, but the present invention is not limited thereto. The present invention may be applied to a light emitting element array used for optical transmission, and in this case, the light emitting element array may be combined with an optical transmission path, and light emission from a first light emitting unit and light emission from a second light emitting unit may be allowed to pass through the same optical transmission path, or may be allowed to pass through different optical transmission paths. The present invention may be applied to a light emitting substrate used for optical measurement, a light receiving element that receives light emitted from a first light emitting unit and second light emitting unit may be configured on the same substrate, and a lens through which the light emitted from the first light emitting unit and second light emitting unit passes before the emitted light reaches an object may be added.

(H08) In the exemplary embodiment, the configuration in which the light emitting unit is applied to each of the light emitting thyristors and the present invention is applied to the wiring to the light emitting thyristor is exemplified, but the present invention is not limited thereto. For example, the present invention may be applied to a wiring for a light emitting element group including plural light emitting elements, that is, a wiring in which plural light emitting elements are connected in common.

What is claimed is:

1. A laminated substrate comprising:
   a base layer including a mesa portion having a trapezoidal cross section, the mesa portion having a first inclined surface extending downward and outward from a top surface and a second inclined surface having an eaves-shaped portion protruding outward from the top surface; and
   a wiring formed on an upper surface of the base layer, the wiring being formed by removing a portion of a wiring layer not covered with a resist layer with an etchant, the resist layer being formed on an upper surface of the wiring layer formed on the upper surface of the base layer and having a shape corresponding to a shape of the wiring,
   wherein the wiring is arranged at a position where the wiring is away from the eaves-shaped portion not to cover the eaves-shaped portion.

2. A light emitting element substrate, comprising:
   the laminated substrate according to claim 1,
   wherein the laminated substrate comprises a light emitting unit, and
   wherein the wiring supplies a current to the light emitting unit.

3. A method for manufacturing a laminated substrate, the method comprising:
   removing a portion of a wiring layer not covered with a resist layer from a laminated substrate with an etchant to form a wiring,
   wherein the laminated substrate comprises:
      a base layer including a mesa portion having a trapezoidal cross section, the mesa portion having a first inclined surface extending downward and outward from a top surface and a second inclined surface having an eaves-shaped portion protruding outward from the top surface;
      the wiring layer formed on an upper surface of the base layer; and
      the resist layer formed on an upper surface of the wiring layer and having a shape corresponding to a shape of the wiring, and
   wherein the wiring is arranged at a position where the wiring is away from the eaves-shaped portion not to cover the eaves-shaped portion.

4. The method for manufacturing a laminated substrate according to claim 3, wherein in a case where a distance between the wiring and the eaves-shaped portion is shorter than a thickness of the wiring, a width of the wiring is set to be at least twice the thickness of the wiring.

5. The method for manufacturing a laminated substrate according to claim 4, wherein in a case where the second inclined surfaces are present on both sides of the wiring in a width direction, the width of the wiring is set to be at least three times the thickness of the wiring.

6. A method for manufacturing a laminated substrate, the method comprising:
   removing a portion of a wiring layer not covered with a resist layer from a laminated substrate with an etchant to form a wiring,
   wherein the laminated substrate comprises:
      a base layer including a mesa portion having a trapezoidal cross section, the mesa portion having a first inclined surface extending downward and outward from a top surface and a second inclined surface having an eaves-shaped portion protruding outward from the top surface;
      the wiring layer formed on an upper surface of the base layer; and
      the resist layer formed on an upper surface of the wiring layer and having a shape corresponding to a shape of the wiring, and
   wherein the wiring is arranged at a position where none of the wiring covers the eaves-shaped portion.

\* \* \* \* \*